(12) United States Patent
Kim et al.

(10) Patent No.: US 12,158,496 B2
(45) Date of Patent: Dec. 3, 2024

(54) CHIP-ON-FILM TEST BOARD

(71) Applicant: LX SEMICON CO., LTD., Daejeon (KR)

(72) Inventors: Min Suk Kim, Daejeon (KR); Seung Il Hong, Daejeon (KR); Jung Ho Kim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 216 days.

(21) Appl. No.: 17/979,084

(22) Filed: Nov. 2, 2022

(65) Prior Publication Data
US 2023/0152370 A1 May 18, 2023

(30) Foreign Application Priority Data
Nov. 16, 2021 (KR) .................... 10-2021-0157716

(51) Int. Cl.
*G01R 31/28* (2006.01)
(52) U.S. Cl.
CPC ................................ *G01R 31/2886* (2013.01)
(58) Field of Classification Search
CPC ............. G01R 31/2886; G01R 1/0408; G01R 31/2808; G01R 31/2817; G01R 31/2863; G01R 1/0466; G01R 31/2865; H01L 22/30

USPC ................................................... 324/762.01
See application file for complete search history.

(56) References Cited

U.S. PATENT DOCUMENTS

| | | | |
|---|---|---|---|
| 2003/0218474 A1* | 11/2003 | Sanada | G01R 31/2863 438/18 |
| 2007/0182440 A1* | 8/2007 | Cha | G09G 3/006 324/760.01 |
| 2007/0194802 A1* | 8/2007 | Ohtaki | G01R 31/2863 324/750.05 |
| 2020/0135695 A1* | 4/2020 | Liao | H01L 23/5387 |
| 2020/0279820 A1* | 9/2020 | Lu | H01L 23/544 |
| 2021/0027680 A1* | 1/2021 | Im | G06F 1/1637 |
| 2021/0074622 A1* | 3/2021 | Koo | H05K 1/0268 |

FOREIGN PATENT DOCUMENTS

| | | |
|---|---|---|
| KR | 10-1158119 B1 | 6/2012 |
| KR | 10-2014-0131605 A | 11/2014 |

* cited by examiner

*Primary Examiner* — Tung X Nguyen
*Assistant Examiner* — Robert P Alejnikov, Jr.
(74) *Attorney, Agent, or Firm* — ROTHWELL, FIGG, ERNST & MANBECK, P.C.

(57) ABSTRACT

A chip-on-film test board on which a chip-on-film is mounted according to an embodiment of the present disclosure includes a main board in which a test circuit configured to output a test pattern signal is formed, and a chip-on-film fixing part that fixes a position of the chip-on-film.

16 Claims, 4 Drawing Sheets

CHIP-ON-FILM TEST BOARD

CROSS-REFERENCE TO RELATED APPLICATIONS

This application claims the benefit of the Korean Patent Applications No. 10-2021-0157716 filed on Nov. 16, 2021, which are hereby incorporated by reference as if fully set forth herein.

FIELD

The present specification relates to a chip-on-film test board.

BACKGROUND

Among various processes of manufacturing semiconductors, a high-temperature operating life (HTOL) test is a test for identifying the reliability of a device at a high temperature within an operating range. The HTOL test can predict a product defect rate and an average lifetime of the product by operating a test target semiconductor device at a high temperature.

In particular, the HTOL test may be performed on a test target semiconductor device, which is distinguished from an actually used semiconductor device, due to the structure of a test board used for the test.

SUMMARY

The present disclosure is directed to providing a chip-on-film test board for testing a chip-on-film more quickly and efficiently.

A chip-on-film test board on which a chip-on-film is mounted according to an embodiment of the present disclosure includes a main board in which a test circuit configured to output a test pattern signal is formed, and a chip-on-film fixing part that fixes a position of the chip-on-film.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the accompanying drawings.

DETAILED DESCRIPTION OF THE DISCLOSURE

Figure 1:
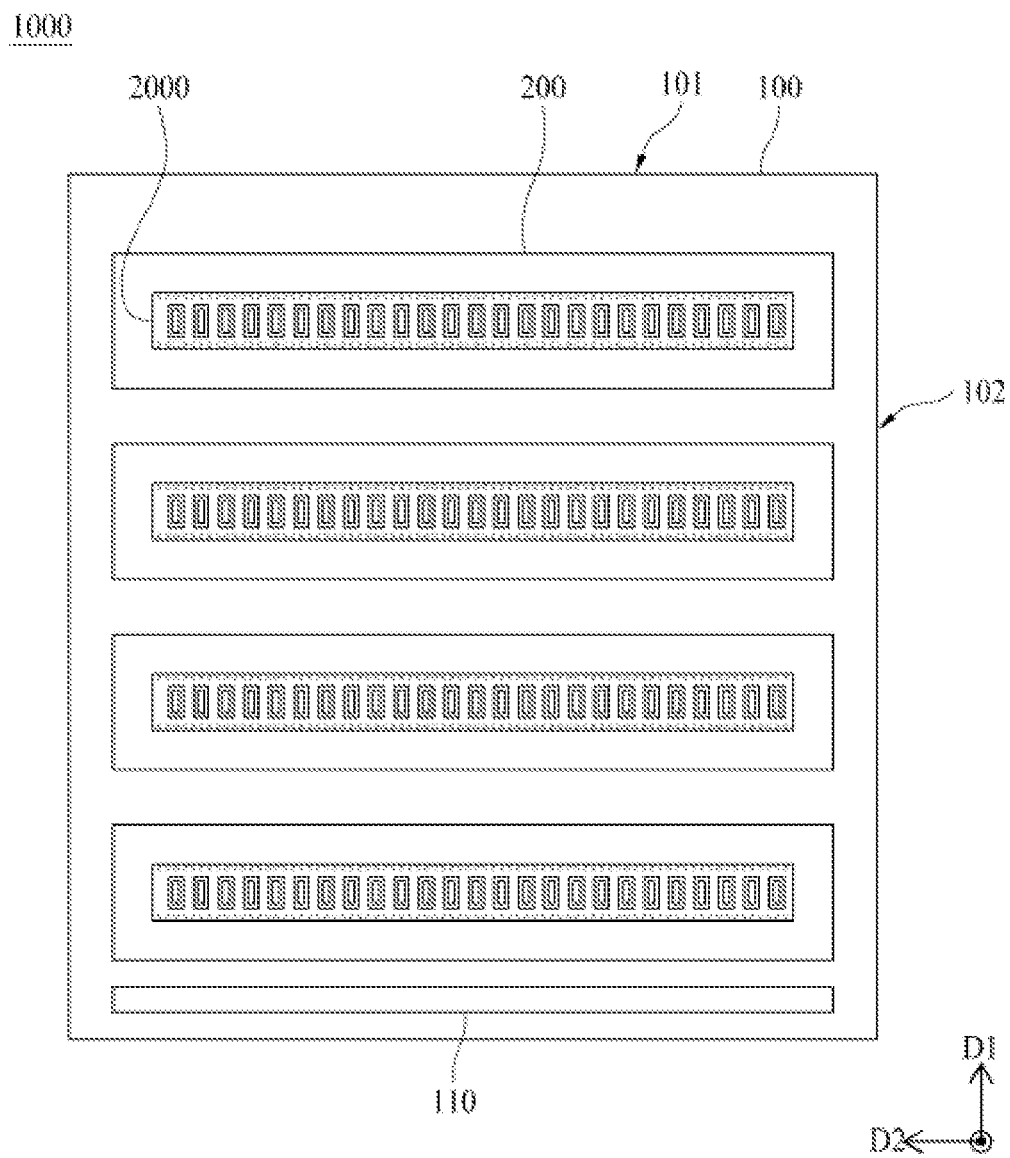
FIG. 1 is a plan view of a chip-on-film test board according to an embodiment of the present disclosure.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only' is used. The terms of a singular form may include plural forms unless referred to the contrary.

In construing an element, the element is construed as including an error range although there is no explicit description.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a chip-on-film test board according to the present disclosure will be described in detail with reference to FIGS. 1 to 6.

Figure 2:
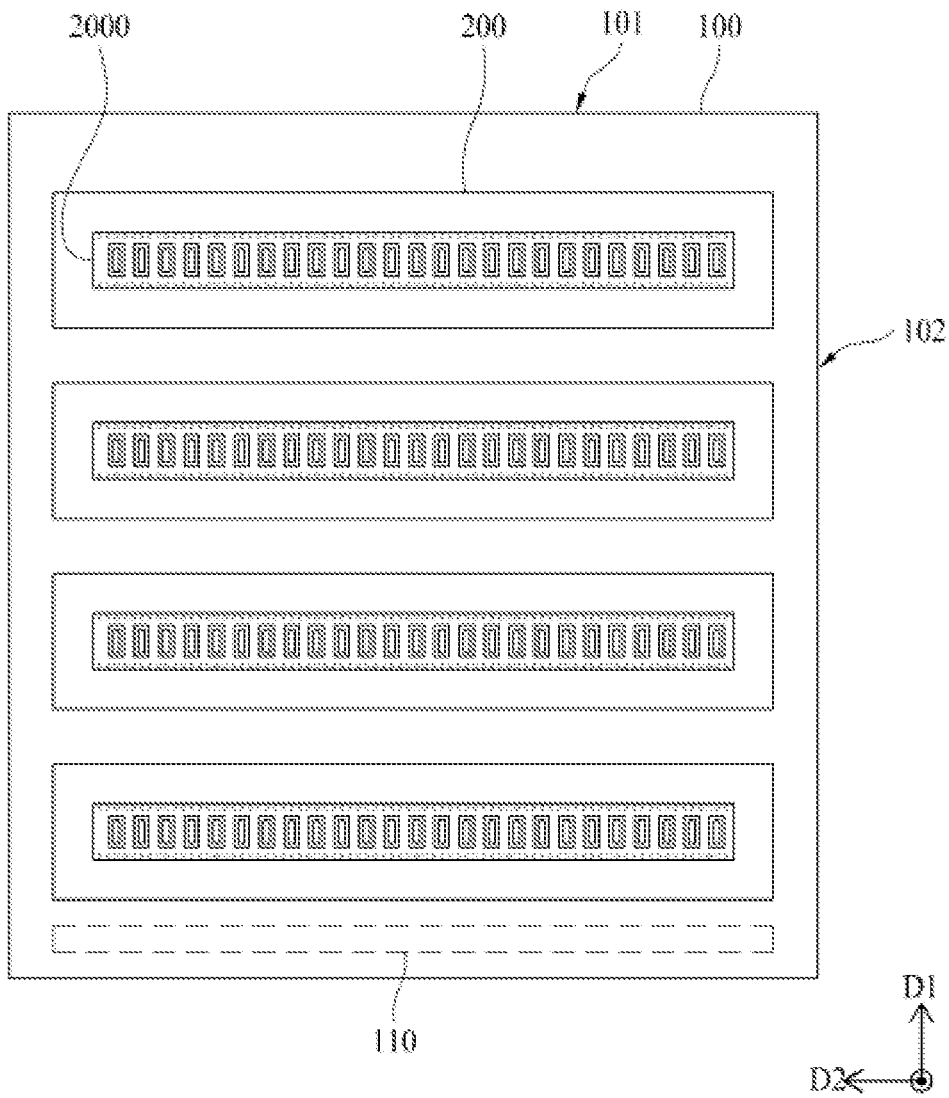
FIG. 2 is a plan view of a chip-on-film test board according to another embodiment of the present disclosure.
Figure 3:
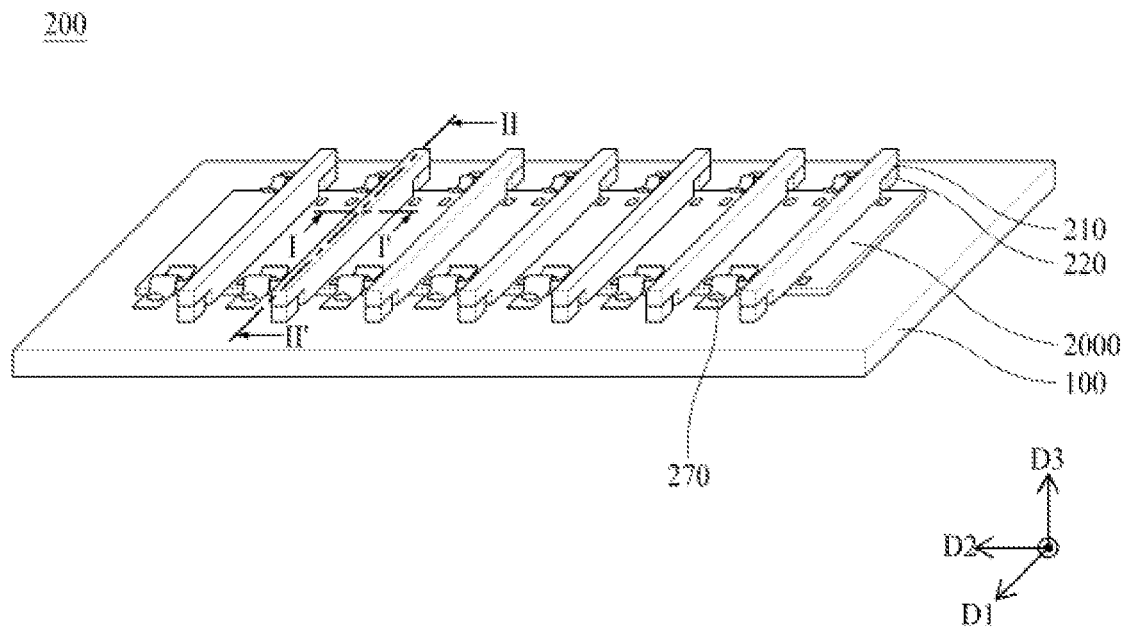
FIG. 3 is an enlarged perspective view of one chip-on-film fixing part of the chip-on-film test board according to an embodiment of the present disclosure.
Figure 4:
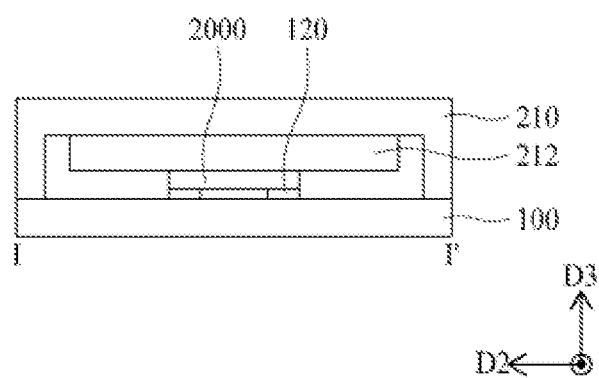
FIG. 4 is a cross-sectional view along line I-I' of FIG. 3.
Figure 5:
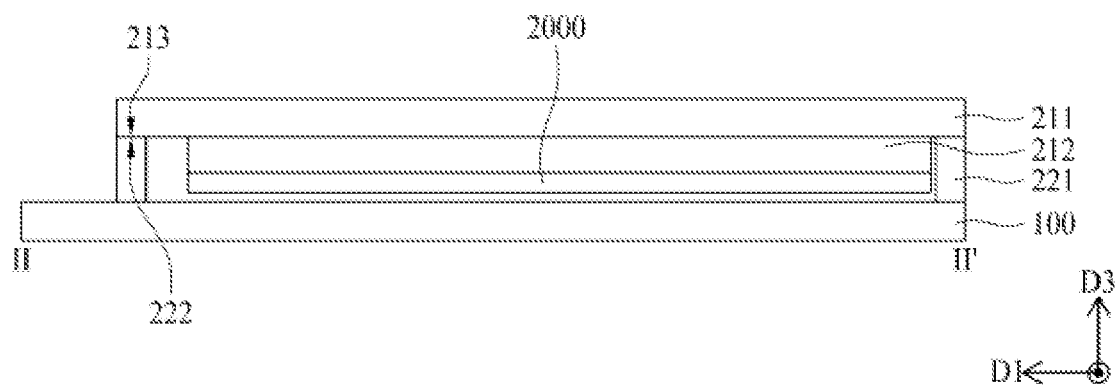
FIG. 5 is a cross-sectional view along line II-II' of FIG. 3.
Figure 6:
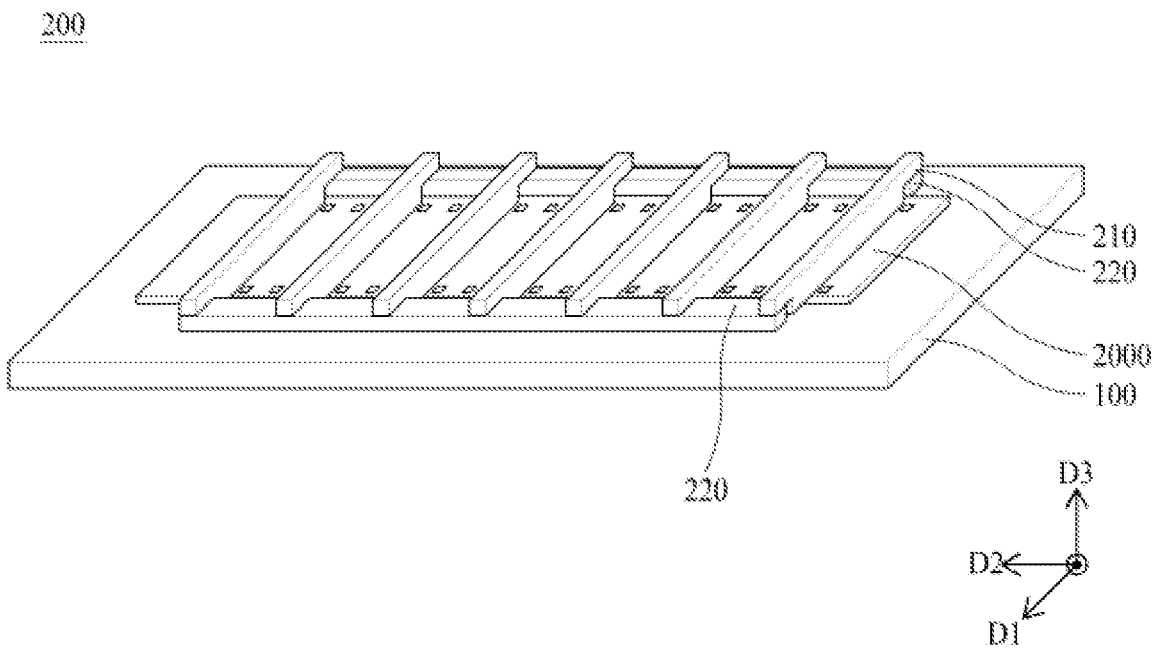
FIG. 6 is an enlarged perspective view of one chip-on-film fixing part of a chip-on-film test board according to still another embodiment of the present disclosure.

FIG. 1 is a plan view of a chip-on-film test board according to an embodiment of the present disclosure, and FIG. 2 is a plan view of a chip-on-film test board according to another embodiment of the present disclosure. FIG. 3 is an enlarged perspective view of one chip-on-film fixing part of the chip-on-film test board according to an embodiment of the present disclosure, FIG. 4 is a cross-sectional view along line I-I' of FIG. 3, and FIG. 5 is a cross-sectional view along line II-II' of FIG. 3. FIG. 6 is an enlarged perspective view of one chip-on-film fixing part of a chip-on-film test board according to still another embodiment of the present disclosure.

Referring to FIG. 1, in order to test a chip-on-film, a chip-on-film 2000 is mounted on a chip-on-film test board 1000 according to the present disclosure, and the chip-on-film test board according to the present disclosure includes a main board 100 and a chip-on-film fixing part 200 that fixes a position of the mounted chip-on-film 2000 and electrically connects the chip-on-film 2000 and the main board 100.

The main board 100 may be formed as a printed circuit board (PCB). In detail, the main board 100 may be formed as the PCB having an area in which the plurality of chip-on-films 2000 and a test circuit 110 may be included so that the plurality of chip-on-films 2000 that are test targets may be simultaneously tested.

In order to test the chip-on-film 2000, the main board 100 includes the test circuit 110, a connection circuit (not illustrated), and a pad part 120 (see FIG. 4).

As illustrated in FIGS. 1 and 2, the main board 100 includes a first surface 101 and a second surface 102 facing the first surface 101.

According to an embodiment of the present disclosure, as illustrated in FIG. 1, both the chip-on-film fixing part 200 and the test circuit 110 may be arranged on one of the first surface 101 and the second surface 102 of the main board 100. That is, the chip-on-film fixing part 200 and the test circuit 110 may be arranged on one surface of the main board 100. The test circuit 110 may be electrically connected to the plurality of chip-on-films 2000 arranged on the main board 100 through a connection circuit formed on the one surface of the main board 100.

Alternatively, according to another embodiment of the present disclosure, as illustrated in FIG. 2, the chip-on-film fixing part 200 may be disposed on the first surface 101 of the main board 100, and the test circuit 110 may be formed on the second surface 102. That is, the chip-on-film fixing part 200 and the test circuit 110 may be arranged on different surfaces of the main board 100. Although not illustrated, the test circuit 110 may be connected to the chip-on-film 2000 that is a test target through a connection hole passing through the main board 100 and a connection circuit positioned inside the connection hole and including a conductor pin.

The test circuit 110 supplies power to the chip-on-film 2000 and outputs a test pattern signal to test the chip-on-film 2000.

According to an embodiment of the present disclosure, the test circuit 110 may be embedded in the main board 100 rather than a separate board. Since the test circuit 110 is embedded in the main board 100, a thickness of the chip-on-film test board 1000 is reduced, and thus a larger number of chip-on-film test boards 1000 may be mounted on test equipment. Accordingly, during one test, a larger number of chip-on-films 2000 can be tested, thereby improving a test progress speed.

The test circuit 110 may be connected to the chip-on-film 2000 that is a test target through the connection circuit to supply power to the chip-on-film 2000 and output the test pattern signal. For example, the test circuit 110 may generate a test pattern signal including an arbitrary clock signal, an arbitrary address signal, an arbitrary control signal, an arbitrary command signal, arbitrary data, and the like to apply the generated test pattern signal to the chip-on-film 2000. Further, the test circuit 110 may receive test result signals output from the chip-on-film 2000 receiving the test pattern signal and determine states of the chip-on-film 2000, a pad part of the chip-on-film 2000, the pad part 120 of the main board 100, or the connection circuit of the main board 100 using the received test result signals.

The connection circuit electrically connects the test circuit 110 embedded in the main board 100 and the pad part 120, which will be described below. The connection circuit may be a wiring line printed on the main board 100.

The pad part 120 (see FIG. 4) may come into contact with and be electrically connected to the pad part of the chip-on-film 2000 that is a test target by the chip-on-film fixing part 200, which will be described below. According to an embodiment of the present disclosure, the pad part 120 is in close contact with the pad part of the chip-on-film 2000 by the chip-on-film fixing part 200, which will be described below. In detail, as an upper fixing part 210 and a lower fixing part 220 are fastened, the mounted chip-on-film 2000 is pressed, and the pad part 120 is in close contact with the pad part of the chip-on-film 2000. Accordingly, the pad part 120 may be in contact with the pad part of the chip-on-film 2000 to electrically connect the test circuit 110 of the main board 100 and the chip-on-film 2000.

The chip-on-film fixing part 200 may fix positions of the plurality of chip-on-films 2000 that is a test target, press the plurality of chip-on-films 2000, allow the chip-on-films 2000 to come into contact with the pad part 120 of the main board 100, and thus electrically connect each chip-on-film 2000 and the test circuit 110.

When the chip-on-film 2000 on which a plurality of chips are mounted is disposed to extend in a second direction D2, as illustrated in FIGS. 1 and 2, the plurality of chip-on-film fixing parts 200 may be arranged in a first direction D1 and positioned to extend in the second direction D2. Alternatively, the plurality of chip-on-film fixing parts 200 may be arranged in each of the first direction D1 and the second direction D2 and may be positioned to extend in the first direction D1 or the second direction D2. However, the chip-on-film fixing part 200 may be formed to have different lengths in the first direction D1 and the second direction D2 to correspond to a direction in which the chip-on-film 2000 extends. However, the embodiment of the present disclosure is not limited thereto, and the chip-on-film fixing part 200 may have the same length in the first direction D1 and the second direction D2 according to a size of chips mounted on the chip-on-film 2000.

As illustrated in FIG. 3, the chip-on-film fixing part 200 may include the upper fixing part 210, the lower fixing part 220, and an auxiliary fixing part 270.

The upper fixing part 210 may be coupled to the lower fixing part 220 to fix a position of the chip-on-film 2000 that is a test target.

The upper fixing parts 210 may be arranged at regular intervals in the second direction D2 in which the chip-on-film 2000 extends.

The upper fixing part 210 may have different lengths in the first direction D1 and the second direction D2. In detail, the upper fixing part 210 may have a shape extending in the first direction D1 perpendicular to the second direction D2 in a plan view, and for example, as illustrated in FIG. 3, the length of the upper fixing part 210 in the first direction D1 may be greater than the length of the upper fixing part 210 in the second direction D2. However, an embodiment of the present disclosure is not limited thereto, and the upper fixing part 210 may have the same length in the first direction D1 and the second direction D2 according to the size of chips mounted on the chip-on-film 2000.

Further, the upper fixing part 210 may extend in the first direction D1 to a position overlapping the lower fixing part 220 in a plan view and may be fastened to the lower fixing part 220 at the position overlapping the lower fixing part 220.

As illustrated in FIGS. 4 and 5, the upper fixing part 210 may include a first housing 211, a pressing part 212, and a first fastening part 213.

The first housing 211 may accommodate and protect the pressing part 212 and the first fastening part 213, which will be described below, and may have a shape in which the first fastening part 213 and a second fastening part 222, which will be described below, are easily fastened or unfastened. For example, as described above, the first housing 211 may have a rectangular shape in which a length thereof in the first direction D1 is greater than a length thereof in the second direction D2 in a plan view and may include an auxiliary housing, such as a button, for easy fastening or unfastening of the first fastening part 213 and the second fastening part 222.

The pressing part 212 presses the chip-on-film 2000 inside the first housing 211 to fix the position of the chip-on-film 2000 and electrically connects the test circuit 110 of the main board 100 and the chip-on-film 2000. In detail, as the upper fixing part 210 is fastened to the lower fixing part 220, the pressing part 212 presses the chip-on-film 2000 mounted between the upper fixing part 210 and the main board 100 to fix the position of the chip-on-film 2000 as illustrated in FIGS. 3 to 5. To this end, the pressing part 212 may have an elastic shape made of an elastic material. For example, the pressing part 212 may be a sheet-shaped member having elasticity, may be made of rubber or silicone having elasticity due to the nature of the material itself, and may have a structure in which a polymer resin having an elastic force is foamed, a structure including a spring, or the like in terms of a structure or shape. However, the present disclosure is not limited thereto, and the pressing part 212 may be made of a material that exhibits an elastic pressing force.

Accordingly, the pressing part 212 allows the pad part (not illustrated) of the chip-on-film 2000 and the pad part 120 of the main board 100 to come into contact and be electrically connected with each other. Accordingly, the pressing part 212 may electrically connect the test circuit 110 and the chip-on-film 2000 through the pad part 120 of the main board 100 and the pad part of the chip-on-film 2000 electrically connected to each other.

As described above, the first fastening part 213 is fastened to the second fastening part 222 of the lower fixing part 220 at a position overlapping the lower fixing part 220. The first fastening part 213 may include a structure which includes a permanent magnet or an electromagnet and is coupled to the second fastening part 222 by a magnetic force. Alternatively, the first fastening part 213 may include a fastening structure such as a bolt, a rivet, a fastening groove, a fastening hole, and a fastening ball and may be coupled to the second fastening part 222. According to an embodiment of the present disclosure, the structure of the first fastening part 213 is not limited thereto, and the first fastening part 213 may include all structures that may be coupled to the second fastening part 222.

The lower fixing part 220 may be coupled to the upper fixing part 210 to fix the position of the chip-on-film 2000 that is a test target.

As illustrated in FIG. 3, the lower fixing part 220 may be positioned to face each other in the first direction D1 perpendicular to the second direction D2 in which the chip-on-film 2000 extends. In detail, in a state in which the chip-on-film 2000 is mounted in the second direction D2, the lower fixing parts 220 may be arranged facing each other in the first direction D1 with the chip-on-film 2000 interposed therebetween in a plan view.

According to an embodiment of the present disclosure, each lower fixing part 220 may be fastened to one upper fixing part 210.

The lower fixing parts 220 may be arranged at regular intervals in the second direction D2 in which the chip-on-film 2000 extends.

The lower fixing part 220 may include a second housing 221 and a second fastening part 222.

The second housing 221 may accommodate and protect the second fastening part 222, which will be described, and may have a shape in which the first fastening part 213 and the second fastening part 222 are easily fastened to each other or unfastened from each other. For example, as described above, the second housing 221 may include an auxiliary housing, such as a button, for easy fastening or unfastening of the first fastening part 213 and the second fastening part 222.

The second fastening part 222 may be fastened to the first fastening part 213 of the upper fixing part 210. The second fastening part 222 may include a structure which includes a permanent magnet or an electromagnet and is coupled to the first fastening part 213 by a magnetic force. Alternatively, the second fastening part 222 may include a fastening structure such as a bolt, a rivet, a fastening groove, and a fastening ball and may be fastened to the first fastening part 213. According to an embodiment of the present disclosure, the structure of the second fastening part 222 is not limited thereto, and the second fastening part 222 may include all structures that may be coupled to the first fastening part 213.

According to an embodiment of the present disclosure, as illustrated in FIGS. 2 to 4, the upper fixing part 210 and the lower fixing part 220 may fix the position of the chip-on-film 2000. In detail, the upper fixing part 210 fixes the position of the chip-on-film 2000 in the second direction D2 and a third direction D3, and the lower fixing part 220 fixes the position of the chip-on-film 2000 in the first direction D1. The chip-on-film 2000 is positioned between the two lower fixing parts 220 facing each other in the first direction D1, and thus the position of the chip-on-film 2000 in the first direction D1 is fixed. The upper fixing part 210 is coupled or fixed to the lower fixing part 220 to press the chip-on-film 2000 so as to fix the position of the chip-on-film 2000 in the second direction D2 and the third direction D3.

According to an embodiment of the present disclosure, when the upper fixing part 210 and the lower fixing part 220 are unfastened from each other, the chip-on-film 2000 may be automatically moved in the second direction D2 by a handler of automatic test equipment. For example, since the chip-on-film 2000 may be automatically moved like a conveyor belt by the handler of the test equipment, a user may automate a process of directly fixing the position of the chip-on-film 2000 to repeat the test, and thus the test can be performed more quickly and efficiently using the test board according to the present disclosure.

According to an embodiment of the present disclosure, the upper fixing part 210 may be an upper jig, and the lower fixing part 220 may be a lower jig. Since the upper fixing part 210 and the lower fixing part 220 fixing the chip-on-film 2000 through a jig structure do not have a large area, the test circuit 110 may be formed on the main board 100, and a larger number of chip-on-films 2000 can be tested using one test board 1000. Further, since the test circuit 110 is positioned on the main board 100 rather than a separate board, a total thickness of the test board 1000 is reduced, a larger number of test boards can be mounted on the test equipment, and thus a larger number of chip-on-films 2000 can be tested. Thus, the test can be performed more quickly and efficiently using the test board according to the present disclosure.

Further, the position of the chip-on-film 2000 to be actually used as well as a chip-on-film to be tested may be fixed according to the size of the chip-on-film fixing part 200 of the test board 1000 according to the present disclosure. That is, according to an embodiment of the present disclosure, the chip-on-film 2000 to be actually used as well as the chip-on-film to be tested having a predetermined standard may be tested, and thus quality assurance and quality improvement of the chip-on-film 2000 can be achieved.

As illustrated in FIG. 3, the auxiliary fixing part 270 together with the upper fixing part 210, the lower fixing part 220, and the pressing part 212 may fix the position of the chip-on-film 2000. In detail, the auxiliary fixing parts 270 may be positioned between the plurality of upper fixing parts 210 arranged in the second direction D2 or between the plurality of lower fixing parts 220 arranged in the second direction D2 and may be positioned to face each other in the first direction D1 to fix the position of the chip-on-film 2000 in the first direction D1, the second direction D2, and the third direction D3. Further, the auxiliary fixing part 270 allows the pad part 120 of the main board 100 and the pad part of the chip-on-film 2000 to come into contact with each other so as to electrically connect the test circuit 110 of the main board 100 and the chip-on-film 2000.

According to still another embodiment of the present disclosure, as illustrated in FIG. 6, the lower fixing part 220 may have a shape extending in the second direction D2. In detail, the lower fixing parts 220 extend in the second direction D2 in which the chip-on-film 2000 extends and is mounted and are arranged to face each other in the first direction D1 with the chip-on-film 2000 interposed therebetween. Accordingly, the position of the chip-on-film 2000 in the first direction D1 may be fixed by the two lower fixing parts 220 arranged to face each other with the chip-on-film 2000 interposed therebetween.

Further, the lower fixing part 220 may have a shape extending in the second direction D2 and may be disposed at a position crossing the upper fixing part 210 having a shape extending in the first direction D1 in a plan view.

The lower fixing parts 220 may be fastened to the plurality of upper fixing parts 210. That is, as the plurality of upper fixing parts 210 extending in the first direction D1 and the two lower fixing parts 220 extending in the second direction D2 are fastened, the position of the chip-on-film 2000 is fixed, and the test circuit 110 of the main board 100 and the chip-on-film 2000 are electrically connected.

Since a chip-on-film fixing part of a chip-on-film test board according to the present disclosure does not occupy a large area, a test circuit can be embedded in a main board, and a larger number of chip-on-films can be tested using one test board. Further, since the test circuit is positioned on the main board rather than a separate board, the total thickness of the test board is reduced, a larger number of test boards can be mounted on test equipment, and thus a larger number of chip-on-films can be tested. That is, the test can be performed more quickly and efficiently using the chip-on-film test board according to the present disclosure.

Further, in the chip-on-film test board according to the present disclosure, a chip-on-film to be actually used as well as a chip-on-film to be tested can be tested, and thus quality assurance and quality improvement of the chip-on-film can be achieved.

In the chip-on-film test board according to the present disclosure, the test can be automated using a handler of automatic test equipment, and thus a test progress speed can be improved.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

Therefore, it should be understood that the above-described embodiments are not restrictive but illustrative in all aspects. The scope of the present disclosure is defined by the appended claims rather than the detailed description, and it should be construed that all alternations or modifications derived from the meaning and scope of the appended claims and the equivalents thereof fall within the scope of the present disclosure.

What is claimed is:

1. A chip-on-film test board on which a chip-on-film is mounted, the chip-on-film test board comprising:
    a main board in which a test circuit configured to output a test pattern signal is embedded; and
    a chip-on-film fixing part that fixes a position of the chip-on-film and electrically connects the chip-on-film to the test circuit, wherein the chip-on-film fixing part includes:
    lower fixing parts that are disposed facing each other in a first direction in a plan view with the chip-on-film interposed therebetween, and fix the position of the chip-on-film in the first direction; and
    an upper fixing part that fixes the position of the chip-on-film with respect to a second direction perpendicular to the first direction and a third direction perpendicular to the first direction and the second direction.

2. The chip-on-film test board of claim 1, wherein
    the main board further includes a pad part electrically connected to the test circuit, and
    when the upper fixing part and the lower fixing parts are fastened to each other in a state in which the chip-on-film is mounted, the pad part of the main board is in contact with a pad part of the chip-on-film, and the test circuit and the chip-on-film are electrically connected to each other.

3. The chip-on-film test board of claim 1, wherein
    the upper fixing part includes a first fastening part, and
    the lower fixing parts include a second fastening part fastened to the first fastening part.

4. The chip-on-film test board of claim 1, wherein the lower fixing part is fastened to the upper fixing part.

5. The chip-on-film test board of claim 1, wherein
    the chip-on-film to be mounted extends in the second direction,
    the upper fixing part has a shape extending in the first direction, and
    the lower fixing parts are disposed to overlap the upper fixing part and is fastened to the upper fixing part.

6. The chip-on-film test board of claim 1, wherein
    the chip-on-film test board comprises a plurality of upper fixing parts, and
    each of the lower fixing parts is fastened to one of the plurality of upper fixing parts.

7. The chip-on-film test board of claim 1, wherein the chip-on-film to be mounted extends in the second direction,
the upper fixing part has a shape extending in the first direction, and
at least one of the lower fixing parts has a shape extending in the second direction, is disposed at a position intersecting the upper fixing part in a plan view, and is fastened to a plurality of upper fixing parts.

8. The chip-on-film test board of claim 1, wherein the upper fixing part further includes a pressing part that presses and fixes the chip-on-film between the upper fixing part and the main board and is configured to electrically connect the test circuit and the chip-on-film.

9. The chip-on-film test board of claim 8, wherein the pressing part has an elastic structure and is made of an elastic material.

10. The chip-on-film test board of claim 1, wherein a length of the upper fixing part in the first direction is different from a length of the upper fixing part in the second direction.

11. The chip-on-film test board of claim 1, wherein the chip-on-film fixing part further includes an auxiliary fixing part that is positioned between a plurality of upper fixing parts or a plurality of lower fixing parts in the second direction in a plan view and fixes the position of the chip-on-film in the first direction.

12. The chip-on-film test board of claim 1, wherein each of the upper fixing part and the lower fixing parts has a jig structure.

13. The chip-on-film test board of claim 1, wherein
the main board includes a first surface and a second surface facing the first surface, and
the test circuit and the chip-on-film fixing part are positioned on one of the first surface and the second surface.

14. The chip-on-film test board of claim 1, wherein
the main board includes a first surface and a second surface facing the first surface,
the chip-on-film fixing part is positioned on the first surface, and
the test circuit is positioned on the second surface.

15. The chip-on-film test board of claim 1, wherein the main board further includes:
a pad part electrically connected to the test circuit; and
a connection circuit that connects the pad part and the test circuit.

16. A chip-on-film test board on which a chip-on-film having a plurality of chips mounted thereon is mounted, the chip-on-film board comprising:
a main board in which a test circuit configured to output a test pattern signal is embedded; and
a chip-on-film fixing part that fixes a position of the chip-on-film having the plurality of chips mounted thereon and electrically connects the chip-on-film to the test circuit,
wherein the chip-on-film fixing part includes a lower fixing part that fixes the position of the chip-on-film having the plurality of chips mounted thereon and extending in a second direction perpendicular to a first direction, and
wherein the chip-on-film fixing part further includes an upper fixing part that fixes the position of the chip-on-film with respect to the second direction perpendicular to the first direction and a third direction perpendicular to the first direction and the second direction.

* * * * *